United States Patent
Legros

(10) Patent No.: US 8,324,078 B2
(45) Date of Patent: Dec. 4, 2012

(54) METHOD AND INSTALLATION FOR FRACTURING A COMPOSITE SUBSTRATE ALONG AN EMBRITTLEMENT PLANE

(75) Inventor: David Legros, Froges (FR)

(73) Assignee: Soitec, Bernin (FR)

(*) Notice: Subject to any disclaimer, the term of this patent is extended or adjusted under 35 U.S.C. 154(b) by 600 days.

(21) Appl. No.: 12/170,937

(22) Filed: Jul. 10, 2008

(65) Prior Publication Data

US 2009/0038758 A1 Feb. 12, 2009

(30) Foreign Application Priority Data

Aug. 8, 2007 (FR) .................................... 07 56997

(51) Int. Cl.
*H01L 21/30* (2006.01)
*H01L 21/46* (2006.01)

(52) U.S. Cl. ........................................ 438/458; 438/459

(58) Field of Classification Search .................. 438/458, 438/459

See application file for complete search history.

(56) References Cited

U.S. PATENT DOCUMENTS

| | | | |
|---|---|---|---|
| 5,374,564 A | 12/1994 | Bruel | 437/24 |
| 6,858,517 B2 | 2/2005 | Martinez et al. | 438/455 |
| 6,884,697 B2 | 4/2005 | Schwarzenbach et al. | 438/464 |
| 2003/0049372 A1 | 3/2003 | Cook et al. | 427/248.1 |
| 2003/0113983 A1* | 6/2003 | Henley et al. | 438/458 |
| 2003/0216008 A1* | 11/2003 | Schwarzenbach et al. | 438/458 |
| 2004/0188487 A1* | 9/2004 | Barge et al. | 225/103 |
| 2005/0150597 A1* | 7/2005 | Henley et al. | 156/344 |
| 2007/0022940 A1* | 2/2007 | Boussagol et al. | 117/1 |

FOREIGN PATENT DOCUMENTS

| | | |
|---|---|---|
| EP | 1 359 615 A1 | 11/2003 |
| EP | 1 401 022 A1 | 3/2004 |
| EP | 1 662 550 A1 | 5/2006 |
| WO | WO 2006/093817 A2 | 9/2006 |

OTHER PUBLICATIONS

French Search Report FR 0756997 Dated Apr. 15, 2008.
A. J. Auberton-Herve et al., "Why Can Smart Cut® Change the Future of Microelectronics?", International Journal of High Speed Electronics and Systems, vol. 10, No. 1, pp. 131-146 (2000).

* cited by examiner

*Primary Examiner* — Bac Au
(74) *Attorney, Agent, or Firm* — Winston & Strawn LLP

(57) ABSTRACT

A method of fracturing a composite structure along an embrittlement plane defined between two layers by producing a fracture in the structure along the embrittlement plane. During fracturing, the composite structure is disposed in a boat housing and held in contact against stiffeners disposed on both sides of the structure and aligned parallel to each other. Each stiffener has a diameter that is at least 40% to 300% of the diameter of the composite structure to be fractured.

12 Claims, 2 Drawing Sheets

METHOD AND INSTALLATION FOR FRACTURING A COMPOSITE SUBSTRATE ALONG AN EMBRITTLEMENT PLANE

BACKGROUND

The present invention relates to the general field of manufacturing composite structures particularly utilized for the epitaxy of materials from the III/N group such as GaN, AlGaN, InGaN or materials from the III/V group such as GaAs or materials from the IV group such as germanium. The fields of application of the invention are electronics, optics and optoelectronics.

More precisely, the invention relates to a method of fracturing a composite structure along an embrittlement plane defined between two layers, the method comprising producing a fracture in the structure along the embrittlement plane.

Composite structures may be manufactured according to SMART CUT® technology. This technology allows a composite structure to be made by transferring a thin layer onto a support substrate.

One example of implementation of SMART CUT® technology applied to making SOI wafers is particularly described in document U.S. Pat. No. 5,374,564 or in the article by A. J. Auberton-Hervé et al. entitled "Why can SMART CUT change the future of microelectronics?," Int. Journal of High Speed Electronics and Systems, Vol. 10, No 1, 2000, p. 131-146.

In general, SMART CUT® technology consists of implanting ionic species under a face of the donor substrate to form an embrittlement plane, to put the face of the donor substrate subjected to implantation in close contact with a support substrate, to perform a stabilization heat treatment for bonding, and to perform fracturing of the structure thus obtained at the level of the embrittlement plane to transfer the part of the structure between the surface subjected to implantation and the embrittlement plane onto the support substrate. Fracturing the structure may be done by thermal annealing at a given temperature and/or by supplying mechanical energy. The layer from the donor substrate defined between the embrittlement plane and the face that has undergone implantation is thus transplanted onto the support substrate.

The remaining layer of the donor substrate, called the "negative," is recycled after its surface is polished and cleaned to be used again as a donor substrate in a new thin layer transfer.

The donor substrate requires special fabrication to present a low defect density. Therefore, the donor substrate is particularly costly. Thus, recycling the negative is particularly important to reduce manufacturing costs.

Such being the case, during the utilization of donor substrates in a hard and brittle material (such as GaN, SiC) or in a very fragile material (such as germanium or silicon), fracturing structures disposed horizontally or vertically may lead to breakage of 80% of the negatives. At the time of fracturing, the energy released, which may be very strong locally, may in fact cause the negatives to break.

Various solutions exist to improve the transfer of a thin layer by fracturing a substrate.

One of these known solutions is described in PCT application WO 2006/093817. It provides for reducing the formation of defects (bubbling, cracks and fractures) that appear in the transferred layer when the fracture energy is applied. For this purpose, this document proposes fixation of a substrate by a bonding method, forming a stiffener on the rear face of the support or donor substrate.

Another solution that is known and described in U.S. Pat. No. 6,858,517 applies more particularly to the transfer of a thin layer from an embrittled donor substrate onto a support substrate whose thermal expansion coefficient is different from that of the donor substrate. To reduce the risks of breakage of the transferred layer, this document provides for bonding a substrate, forming a stiffener on the support or donor substrate, the substrate stiffener having a thermal expansion coefficient close to that of the substrate onto which it is bonded.

Yet another known solution is described in U.S. Pat. No. 6,884,697. This solution aims to obtain a homogeneous roughness over the entire surface of the layers obtained. To do this, the embrittled donor substrate is placed horizontally in the furnace allowing fracture thermal annealing, and gripping means are provided to handle the layers horizontally in order to prevent any movement of one layer on another that may result in scratches being formed.

Although these solutions are satisfactory for improving the transfer of the thin layer by fracturing, they do not reduce the risks of breakage of the remaining layer of the donor substrate (i.e., the negative) obtained during fracturing. Thus, further improvements in this area are needed.

SUMMARY OF THE INVENTION

The present invention now remedies the aforementioned disadvantages by providing a method that considerably reduces or limits the number of negative breakages during fracturing.

This method is for fracturing a composite structure along an embrittlement plane defined between two layers, by disposing stiffeners on both sides of the composite structure and spaced from it, and fracturing the composite structure along the embrittlement plane while holding the structure against the stiffeners.

The presence of stiffeners on both sides of the structure ensures that the different materials of the structure are held in a contact known as "held" at the time energy is released during fracturing (as opposed to a contact known as "released"). During fracturing, the energy released is damped by stiffeners in held contact with the structure with the result that the shock wave is absorbed, which considerably limits the risks of breakage of the negative.

According to an advantageous arrangement, the composite structure is placed between two stiffeners, with the cumulative spacing between each stiffener and the structure being other than zero but less than 500 micrometers during fracturing.

According to another advantageous arrangement, each stiffener has a diameter that is at least 40% to 300% of the diameter of the composite structure to be fractured.

During fracturing, the composite structure may be disposed substantially vertically or substantially horizontally.

The embrittlement plane of the composite structure may be formed by implantation of ions and the fracturing may be performed by thermal annealing of the wafer. In this case, the presence of stiffeners on both sides of the structure according to the invention henceforth leads to a significant reduction in the risk of negative breakages.

In fact, it is known that the implantation of ion species into the composite structure creates microcavities in the material that form an embrittled zone. These microcavities are developed during application of the annealing thermal budget until the material along the embrittlement plane is fractured. Such being the case, when the embrittled structure comprises materials having different thermal expansion coefficients, such as germanium on silicon, silicon on quartz, GaAs or InP on silicon, these materials expand differently during application of the thermal budget and the structure forms a bend if the surfaces are not maintained. At the time of fracturing, the energy released, which may be very strong locally, may then cause the negatives to break. On the other hand, in the presence of the stiffeners of the invention, this energy is contained or redistributed so the resulting shock wave is absorbed, and this prevents the negative from breaking.

In addition, holding the structure in held contact allows the development of microcavities to be induced in the direction of the embrittlement plane and their development to be minimized in the direction of the thickness of the structure. The resulting pressure is thus reduced in the direction of thickness of the structure and the constraint is uniform over the entire embrittled zone, thus reducing the local compression points.

The composite structure may be comprised of two substrates having different thermal expansion coefficients and may be made by assembling the two substrates one against the other, with one of the substrates including the embrittlement plane.

Another embodiment of the invention is a housing for a thermal annealing installation boat for a composite structure to be fractured, the housing being configured and able to receive a composite structure to be fractured along an embrittlement plane defined between two layers. The housing includes two stiffening elements spaced apart from each other and aligned parallel to each other, with the cumulative spacing between each stiffening element and the composite structure being different of zero and less than 500 micrometers.

Yet another embodiment of the invention is the installation of thermal annealing of a composite structure to be fractured along an embrittlement plane defined between two layers, the installation comprising a furnace and a boat able to receive a plurality of composite structures, each composite structure being placed in a housing such as defined previously.

BRIEF DESCRIPTION OF THE DRAWINGS

Other characteristics and advantages of the present invention will emerge from the description below, with reference to the appended drawings which illustrate an embodiment lacking any limiting character. In the figures.

DETAILED DESCRIPTION OF THE PREFERRED EMBODIMENTS

Figure 1A:
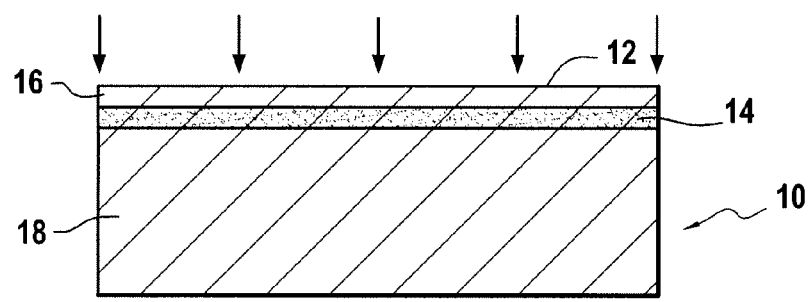
FIGS. 1A to 1C are schematic views in section showing a known layer on substrate technique by a substrate fracturing method.
Figure 1B:
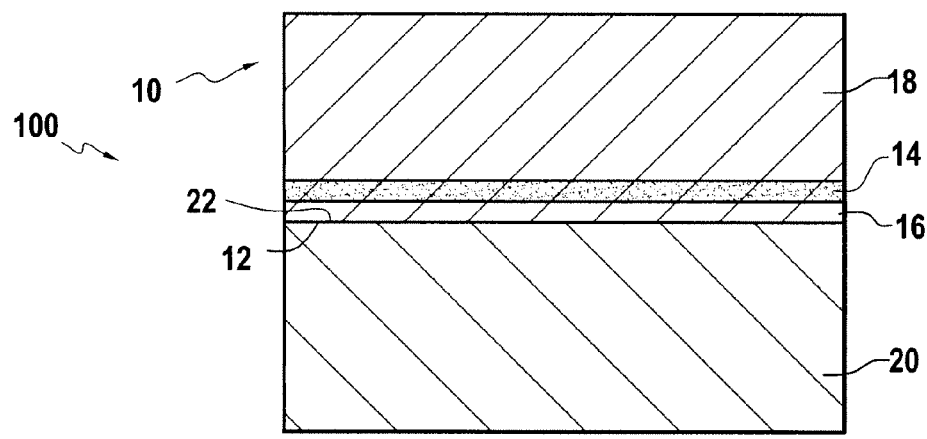
Figure 1C:
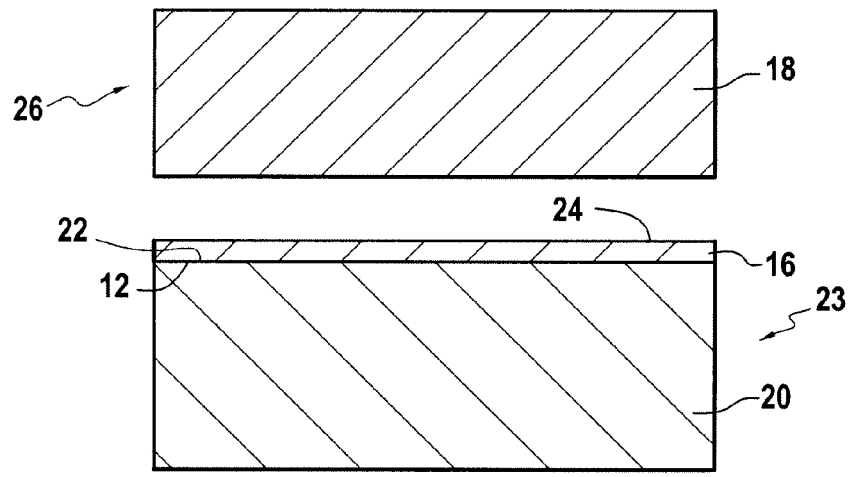

FIGS. 1A to 1C represent an example of producing a layer on a substrate according to known SMART CUT® technology.

In FIG. 1A, reference 10 designates a donor (or source) substrate of a composite structure. The donor substrate may, for example, be a GaN wafer.

According to a first step, ionic implantation is carried out in the donor substrate 10. The implantation corresponds to an ionic bombardment of the flat face 12 of the donor substrate by ionic species such as hydrogen and/or helium ions, for example (the bombardment is represented by arrows in FIG. 1A).

The nature of the implanted species, the implantation doses and energies are chosen according to the thickness of the layer that one wishes to transfer and the physical chemical properties of the implanted substrate.

The ions implanted have the object of forming an embrittlement plane 14 defining a thin layer 16 to be transferred that is situated near the flat face 12 that has undergone implantation and another layer 18 forming the rest of the substrate, called the negative.

Optionally, ionic implantation may be done through an additional layer formed on the flat face 12 of the donor substrate (for example, $SiO_2$) so as to prevent surface contamination.

The next step consists of bonding the flat face 12 of the thin layer 16 to be transferred with a face 22 of a support (or receiver) substrate 20. In the case of a donor substrate in GaN, the support substrate may, for example, be a sapphire wafer.

The donor substrate 10 and the support substrate 20 may present different thermal expansion coefficients.

In a manner that is known in itself, the bonding step corresponds to putting the donor substrate 10 in close contact with the support substrate 20 by molecular adhesion and/or electrostatic bonding, this bonding step being followed by a heat treatment to stabilize the bonding.

FIG. 1B represents the two associated substrates, the flat face 22 of the support substrate 20 adhering to the flat face 12 of the donor substrate 10.

In addition, it is sometimes necessary to deposit a bonding layer and/or an adhesion-promoting layer (for example $SiO_2$ or $Si_3N_4$) on at least one of the two substrates before putting them in contact to improve bonding and to maintain the bonding on the composite structure.

In a last step called fracturing, a thermal budget is applied to the structure thus obtained to detach the thin layer 16 by fracturing at the level of the embrittlement plane 14 formed in the donor substrate 10 and to obtain the transfer of this thin layer 16 on the support substrate 20.

This fracturing step consists of, for example, applying thermal annealing to the assembly in a temperature range on the order of 80° C. to 500° C. to allow transfer of the thin layer 16 on the support substrate.

Following this detachment step, the structure 23 is obtained, which is represented in FIG. 1C.

The roughness of the external face 24 of this structure 23 may possibly be reduced by polishing and the surface may be prepared for subsequent use, such as for epitaxy.

After its surface is polished and cleaned, the remaining layer 26 of the donor substrate, called the negative, is recycled to be used again as a donor substrate in a new thin layer transfer.

In order to limit the risks of breakage of the negatives during the step of fracturing the structure obtained by bonding the donor substrate 10 on the support substrate 20, maintaining the structure in contact against the stiffeners disposed on both sides of the structure during this step is provided according to the invention.

Held contact during fracturing is understood to refer to holding the structure in contact or in a very limited spacing during this step. It should be noted that this held contact does not consist of bonding or affixing the stiffeners onto the structure in any form whatsoever.

Figure 2:
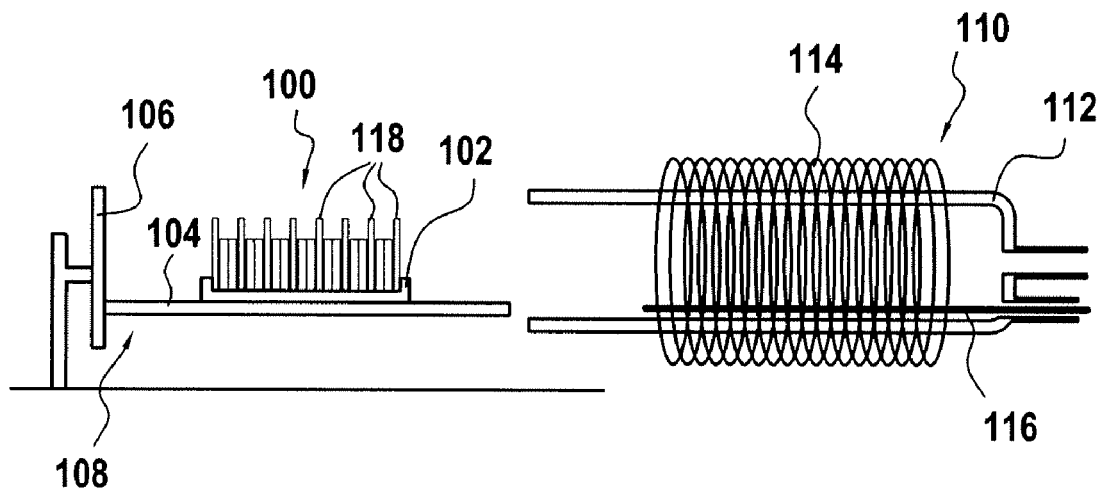
FIG. 2 shows an installation for the implementation of a method according to the invention.

FIG. 2 represents an example of installation of the implementation of such a fracturing method applied to fracturing thermal annealing for structures disposed vertically.

Fracturing thermal annealings are conventionally implemented in annealing furnaces that may process several composite structures simultaneously.

FIG. 2 thus shows a plurality of composite structures 100 to be fractured disposed in a receptacle 102 such as a sapphire or quartz boat, for example, the composite structures are aligned parallel to each other.

The boat 102 is itself placed on a loader 104 fixed to a door 106 for sealing the furnace opening.

The assembly 108 formed by the boat 102, the loader 104 and the door 106 is movable with relation to a furnace structure 110 which includes a quartz processing tube 112 around which a heating element 114 is wound. A pyrometer tube 116 equipped with thermocouples is also provided.

The furnace of FIG. 2 is shown in the open position. In the closed position, the assembly 108 is inserted into the furnace structure 110, the door 106 sealing the furnace opening.

Figure 3:
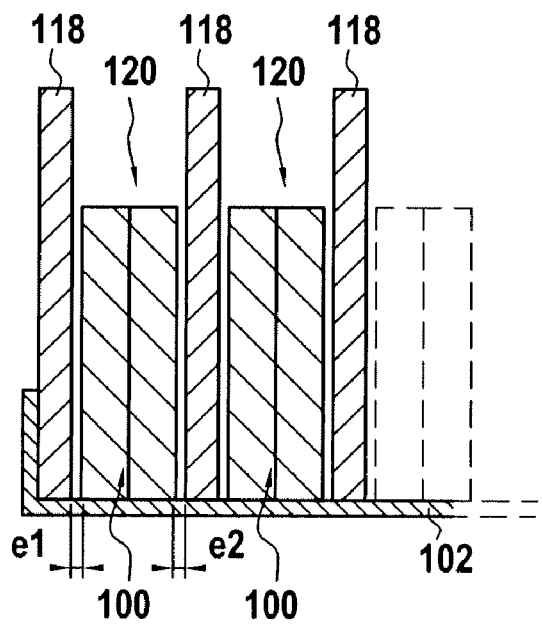
FIG. 3 is an enlargement of FIG. 2.

FIG. 3 represents in further detail a part of the boat 102 in which the composite structures 100 are disposed.

The boat comprises a plurality of stiffening elements 118 disposed vertically and aligned parallel to each other, the spacing between two adjacent stiffening elements forming a housing 120 in which a composite structure to be fractured 100 is disposed.

The spacing defined between the different stiffening elements 118 of the boat is adjustable in such a way that the thickness of each of the housings 120 may be chosen.

The stiffening elements 118 that press against the faces of the composite structure to be fractured are walls in sapphire, quartz or any other material making up the boat.

As the thermal expansion coefficient of the stiffening elements is not predominant in the absorption mechanism of the energy released at the time of fracturing, the materials of these elements are only chosen to be sufficiently mechanically resistant faced with the energy released during thermal annealing.

Advantageously, each stiffener has a minimum diameter that is at least 40% of the composite structure diameter and a maximum diameter that is 300% of the composite structure diameter. A preferred size range is between 50 and 200% of the structure diameter. A more preferred range is between 85% and 150% and the most preferred range is between 90 and 125% of the structure diameter. In specific embodiments, the stiffener diameter is 50%±5% of the composite structure diameter, or is 95%±10% of the composite structure diameter.

The spacing between the stiffeners is calculated according to the thickness of the structure to be fractured 100 such that the cumulative spacing between each stiffener and the structure is maintained less than 500 micrometers during fracture annealing (in FIG. 3, the cumulative spacing is represented by the addition of spacings e1 and e2).

In general, the cumulative spacing between the stiffeners and the composite structure to be fractured is adjusted according to the diameter of the structure and the difference in the thermal expansion coefficient between the substrates making up the structure (these parameters in fact influence the formation and intensity of the bend in the structure during the thermal budget application).

According to one example, a composite structure to be fractured with a diameter of two inches (or 5.08 cm) comprised of a GaN wafer embrittled and bonded onto a sapphire wafer is inserted in a housing 120 whose stiffening elements 118 are spaced so as to leave a cumulative spacing of 320 micrometers during fracture annealing.

Tests carried out with such a configuration demonstrated that the number of negative breakages during fracturing may be reduced by 80% to 10%. Similar results have been obtained with a similar configuration in which the cumulative spacing was 330 micrometers.

In addition, negative breakage is reduced with composite structures disposed both vertically (FIG. 3) and horizontally (not represented in the figures but generally understood by skilled artisans).

In addition, with such a boat 102, the stiffening elements 118 and the composite structures 100 are maintained thanks to restraining bars (not represented in the figures). In a variation of an embodiment, the boat bars may comprise recesses for retaining the stiffening elements and the composite structures.

EXAMPLE

Now an example of embodiment of the method according to the invention will be described.

The donor substrate is a GaN wafer having an embrittlement plane formed by the implantation of $H^+$ ions with energy of 30 to 250 keV and a dose on the order of $10^{17}$ at/cm$^2$.

The support substrate is a sapphire wafer.

A bonding layer such as $SiO_2$ is deposited and prepared on the face of the donor substrate and/or the support substrate for substrate bonding. Bonding is activated by plasma and the two substrates are put in close contact by hydrophilic bonding.

The structure with a diameter of two inches (or 5.08 cm) thus obtained is placed in a housing of the thermal annealing furnace boat such as described previously between two stiffeners formed in the quartz (or any other equivalent material that is sufficiently mechanically resistant). The diameter of each stiffener is two inches (or 5.08 cm). The cumulative spacing between each stiffener and the structure is 320 micrometers.

The structure thus positioned in the furnace is subjected to a temperature incline up to approximately 500° C. to reinforce the substrate bonding and to carry out fracture annealing.

After returning to ambient temperature, the negative and the substrate composed of a thin layer of GaN on a sapphire support are recovered intact by adapted gripping means. In particular, the negative is perfectly intact and may be reutilized after recycling.

What is claimed is:

1. A method of fracturing a composite structure along an embrittlement plane defined between two substrates, which comprises:
    disposing stiffeners on both sides of the composite structure and spaced from it,
    adjusting the spacing between the stiffeners and composite structure so that, during a subsequent fracturing step, the composite structure and the stiffeners on both sides of that structure are separated by a cumulative spacing that is greater than zero but less than 500 micrometers,
    determining the cumulative spacing between the stiffeners and the composite structure to be adjusted according to the diameter of the composite structure and the difference in the thermal expansion coefficient between the substrates making up the structure, and
    fracturing the composite structure along the embrittlement plane by thermal annealing while the structure is held between the stiffeners so that released energy is damped by stiffeners in held contact with the composite structure such that any shock waves are absorbed.

2. The method according to claim 1, wherein each stiffener has a diameter that is at least 40% to 300% of the diameter of the composite structure.

3. The method according to claim 1, wherein each stiffener has a diameter that is at least 50% to 200% of the diameter of the composite structure.

4. The method according to claim 1, wherein each stiffener has a diameter that is 50%±5% or 95%±10% of the diameter of the composite structure.

5. The method according to claim 1, which further comprises disposing the composite structure substantially vertically during the fracturing.

6. The method according to claim 1, which further comprises disposing the composite structure substantially horizontally during the fracturing.

7. The method according to claim 1, which further comprises forming the embrittlement plane of the composite structure by implantation of ions.

8. The method according to claim 1, wherein the composite structure includes two substrates having different thermal expansion coefficients.

9. The method according to claim 1, which further comprises making the composite structure by assembling two substrates against each other, wherein one of the substrates includes the embrittlement plane.

10. The method of claim 1, wherein the thermal annealing is conducted in a housing for a thermal annealing installation boat, wherein the housing is configured to receive the composite structure to be fractured.

11. The method according to claim 1, in which the stiffening elements are aligned parallel to each other.

12. The method according to claim 1, wherein
the thermal annealing is conducted in an installation comprising a furnace, a boat able to receive a plurality of composite structures, and a housing with each composite structure located between a spaced apart pair of stiffeners.

* * * * *